(12) United States Patent
Sakuma

(10) Patent No.: US 11,769,703 B2
(45) Date of Patent: Sep. 26, 2023

(54) SEMICONDUCTOR DEVICE AND METHOD OF MANUFACTURING SAME

(71) Applicant: ABLIC Inc., Tokyo (JP)

(72) Inventor: Mitsuhiro Sakuma, Tokyo (JP)

(73) Assignee: ABLIC INC., Nagano (JP)

( * ) Notice: Subject to any disclaimer, the term of this patent is extended or adjusted under 35 U.S.C. 154(b) by 416 days.

(21) Appl. No.: 17/171,173

(22) Filed: Feb. 9, 2021

(65) Prior Publication Data

US 2021/0249320 A1 Aug. 12, 2021

(30) Foreign Application Priority Data

Feb. 12, 2020 (JP) .................................. 2020-021132

(51) Int. Cl.
*H01L 23/31* (2006.01)
*H01L 23/495* (2006.01)
*H01L 21/56* (2006.01)
*H01L 21/66* (2006.01)
*H01L 21/48* (2006.01)

(52) U.S. Cl.
CPC ...... *H01L 23/3114* (2013.01); *H01L 21/4825* (2013.01); *H01L 21/565* (2013.01); *H01L 22/20* (2013.01); *H01L 23/4952* (2013.01); *H01L 23/49503* (2013.01)

(58) Field of Classification Search
CPC ........... H01L 23/3114; H01L 23/49503; H01L 23/4952; H01L 21/4825; H01L 21/565
See application file for complete search history.

(56) References Cited

U.S. PATENT DOCUMENTS

| | | | | |
|---|---|---|---|---|
| 2013/0161665 A1* | 6/2013 | Kuwaharada | ........... | H01L 33/54 257/98 |
| 2013/0334556 A1* | 12/2013 | Park | ...................... | H01L 33/486 257/98 |
| 2015/0145109 A1* | 5/2015 | Bemmerl | .......... | H01L 23/49548 257/779 |
| 2021/0057620 A1* | 2/2021 | Abe | ...................... | H01L 25/167 |

FOREIGN PATENT DOCUMENTS

| JP | H10335544 A | * | 5/1997 | ............. | H01L 21/56 |
|---|---|---|---|---|---|
| JP | 2009-278024 A | | 11/2009 | | |

* cited by examiner

*Primary Examiner* — Marc Anthony Armand
(74) *Attorney, Agent, or Firm* — Crowell & Moring LLP

(57) ABSTRACT

A semiconductor element is mounted on a die pad, and electrode pads arranged at an outer circumference of a surface of the semiconductor element are electrically connected to leads by wires, respectively. The semiconductor element, the die pad, and the leads are covered with an encapsulating resin. The semiconductor element has an element region having a high sensitivity with respect to stress, and an element region having a relatively low sensitivity with respect to stress. A recessed portion is formed in a surface of the encapsulating resin at a position above the element region having a high sensitivity with respect to stress.

18 Claims, 9 Drawing Sheets

US 11,769,703 B2

SEMICONDUCTOR DEVICE AND METHOD OF MANUFACTURING SAME

RELATED APPLICATIONS

This application claims priority to Japanese Patent Application No. 2020-021132, filed on Feb. 12, 2020, the entire content of which is incorporated herein by reference.

BACKGROUND OF THE INVENTION

1. Field of the Invention

The present invention relates to a semiconductor device and a method of manufacturing the same.

2. Description of the Related Art

Along with the needs for downsizing and reducing the weight of electronic devices and improving the functions thereof, surface mount packages have been frequently used. A surface mount package allows high-density mounting of semiconductor devices on an electronic device. In analog ICs or the like, in recent years, further increase in accuracy of electrical characteristics has been demanded. However, during a packaging step or other mounting steps, stress may be applied to a semiconductor element to cause variations in electrical characteristics. Accordingly, target electrical characteristics may not be obtained.

There has been proposed a fully-molded type semiconductor device in which resin thicknesses above and below a die pad are set to be the same, to thereby reduce warpage to be caused by the stress at the time of mounting the semiconductor device (see, for example, Japanese Patent Application Laid-open No. 2009-278024).

However, the fully-molded type semiconductor device is insufficient in heat radiation performance, and heat generated from the semiconductor element may be accumulated to deteriorate the electrical characteristics of the semiconductor device.

SUMMARY OF THE INVENTION

The present invention has an object to provide a semiconductor device capable of reducing stress to be applied to a semiconductor element, even in a case of a non-leaded type semiconductor device.

In order to solve the above-mentioned problem, the present invention adopts the following measures.

A semiconductor device includes: a die pad; a semiconductor element mounted on the die pad; a lead which is arranged so as to be spaced apart from the die pad, and is electrically connected to the semiconductor element; and an encapsulating resin for encapsulating the die pad, the semiconductor element, and the lead, wherein the semiconductor element has an element region having a high sensitivity with respect to stress, and a recessed portion is formed in a surface of the encapsulating resin at a position above the element region.

Further, there is employed a method of manufacturing a semiconductor device including: a die pad; a semiconductor element mounted on the die pad; a lead which is arranged so as to be spaced apart from the die pad, and is electrically connected to the semiconductor element; and an encapsulating resin for encapsulating the die pad, the semiconductor element, and the lead, the method including: mounting the semiconductor element on the die pad and preparing the lead arranged so as to be spaced apart from the die pad; preparing a mold which is for use to encapsulate the lead and the die pad having the semiconductor element mounted thereon, and has a protruding portion for forming a recessed portion; and encapsulating the die pad having the semiconductor element mounted thereon and forming the recessed portion facing the protruding portion in a surface of the encapsulating resin at a position above an element region having a high sensitivity with respect to stress of the semiconductor element.

Through use of the above-mentioned measures, the semiconductor device capable of reducing the stress to be applied to the semiconductor element from the encapsulating resin can be achieved.

DETAILED DESCRIPTION OF THE PREFERRED EMBODIMENTS

Now, a semiconductor device according to each embodiment of the present invention is described in detail.

Figure 1A:
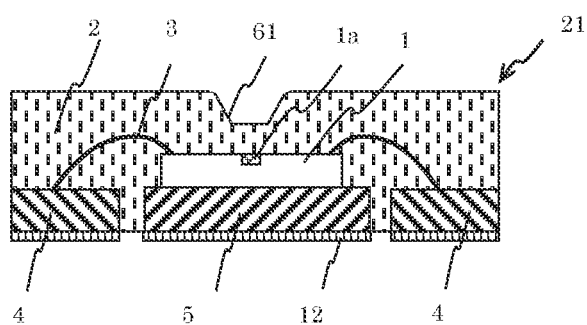
FIG. 1A and FIG. 1B show a semiconductor device according to a first embodiment of the present invention.
Figure 1B:
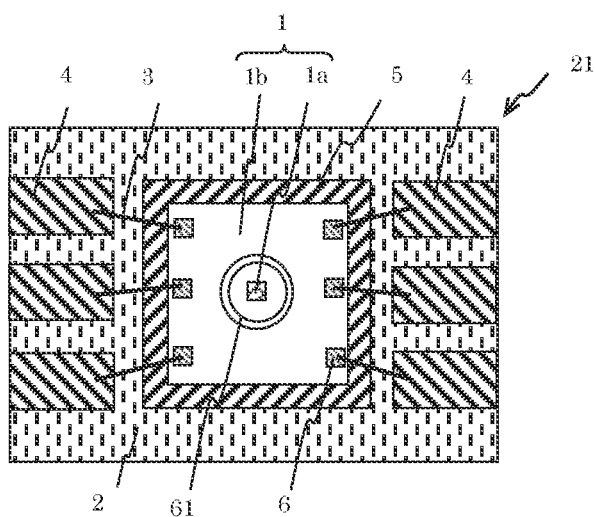

FIG. 1A and FIG. 1B show a semiconductor device according to the first embodiment of the present invention. As illustrated in the sectional view of FIG. 1A, a semiconductor element 1 is mounted on a die pad 5 made of a copper (Cu) alloy or the like. Leads 4 are provided around the die pad 5 so as to be spaced apart from the die pad 5. Further, electrode pads (not shown) provided on an upper surface of the semiconductor element 1 are electrically connected to upper surfaces of the leads 4 by wires 3 serving as connecting members, respectively. As the material for the wires 3, gold (Au) or copper (Cu) is used. The electrical connection between the semiconductor element 1 and the leads 4 is not limited to the wiring method, and there may be employed a flip-chip bonding method using bumps.

Peripheries of the semiconductor element 1, the die pad 5, and the wires 3 are covered with an encapsulating resin 2, but the back surface of the die pad 5 which is the opposite side of the surface on which the semiconductor element 1 is mounted is exposed from the encapsulating resin 2. The back surface of the die pad 5 is covered with a plating layer 12 to have a structure excellent in heat radiation performance. The Bottom surface and an outer side surface of each of the leads 4 are also exposed from the encapsulating resin 2, and the exposed bottom surfaces of the leads 4 are also covered with the plating layer 12. The outer side surfaces of the leads 4 are not protruded from side surfaces of the encapsulating resin, thereby forming a non-leaded type semiconductor device 21. The plating layer 12 is made of any one of metals of lead (Pb), bismuth (Bi), tin (Sn), copper (Cu), silver (Ag), palladium (Pd), and gold (Au), or an alloy of a plurality of the metals, and is formed by an electrolytic plating method or a non-electrolytic plating method.

The semiconductor element 1 included in the semiconductor device 21 has, in a part of the surface thereof, an element region 1a having a high sensitivity with respect to stress, and a recessed portion 61 is formed in a surface of the encapsulating resin 2 at a position above the element region 1a. The recessed portion 61 is selectively formed above the element region 1a having a high sensitivity with respect to stress and is formed not to overlap the entire region of the semiconductor element 1. In this case, the recessed portion 61 has an inverted trapezoid shape in the sectional view. The upper base of the inverted trapezoid is longer than the lower base thereof, and leg portions of the inverted trapezoid are tapered. Further, the upper base, the lower base, and the upper surface of the semiconductor element 1 are parallel to one another.

FIG. 1B is a transparent plan view as viewed from the top of the semiconductor device. The die pad 5 is arranged in a center region of the rectangular encapsulating resin 2. A plurality of leads 4 are arranged along one side (side surface) of the encapsulating resin 2, and a plurality of leads 4 are arranged along another side (side surface) opposed to the one side. Further, the leads 4 arranged along the respective sides (side surfaces) face each other across the die pad 5. The semiconductor element 1 is mounted on the die pad 5, and electrode pads 6 arranged along the outer circumference of the semiconductor element 1 are electrically connected to the leads 4 by the wires 3, respectively. The semiconductor element 1 has the element region 1a having a high sensitivity with respect to stress, and an element region 1b having a relatively low sensitivity with respect to stress.

By resin shrinkage during resin hardening and during return to normal temperature of the high-temperature molten resin injected into a mold, stress such as compression or shear may be applied to the semiconductor element 1 made of silicon, generating a piezoelectric effect in the single crystal silicon, to thereby cause variations in electrical characteristics of semiconductor integrated circuit elements formed on the surface of the semiconductor element. Among the semiconductor integrated circuit elements, an element whose electrical characteristics are liable to vary by the piezoelectric effect corresponds to an element formed in the element region having a high sensitivity with respect to stress. For example, a current mirror circuit uses the fact that the currents having the same magnitude flow through the P-channel MOS transistors forming a pair, to thereby take an action in which currents of two current paths are made equal. However, application of stress to this circuit causes deviation of the currents of the two current paths. The transistors forming such a pair should have characteristics that are little different from each other, and are desired to be formed in the above-mentioned element region 1a having a high sensitivity with respect to stress.

A planar projection region obtained from a planar projection of the recessed portion 61 onto the semiconductor element 1 is formed so as to include, and surround the peripheral portion of, the element region 1a having a high sensitivity with respect to stress, and the peripheral portion of the planar projection region has a circular shape. The recessed portion 61 is illustrated as double concentric circles in which the outer circle projects the uppermost portion of the recessed portion 61 while the inner circle projects the contour at the bottom surface of the recessed portion 61. Further, the element region 1a having a high sensitivity with respect to stress is provided in the vicinity of the center of the recessed portion 61 in the inner circle. Since the electrode pads 6 are arranged in the outer circumference of the semiconductor element 1, the planar projection region of the recessed portion 61 is desired not to overlap the regions in which the electrode pads 6 are arranged. As illustrated in FIG. 1A, the wires 3 are each formed in a loop shape, and a loop height thereof is higher than the upper surface of the semiconductor element 1. In a case in which the recessed portion 61 overlaps the regions in which the electrode pads 6 are arranged and in which the recessed portion 61 is deep, there is a concern in that the wire 3 may be exposed from the recessed portion 61 to reduce the reliability. It is thus desired that the planar projection region of the recessed portion 61 do not overlap the regions in which the electrode pads 6 are arranged. In consideration of a margin of the planar projection region of the recessed portion 61 and the element region 1a having a high sensitivity with respect to stress, the element region 1a having a high sensitivity with respect to stress is more desired to be provided in the vicinity of the center of the semiconductor element 1.

Since the recessed portion 61 is formed in the surface of the encapsulating resin 2 at a position above the element region 1a having a high sensitivity with respect to stress, the thickness of the encapsulating resin 2 above the element region 1a having a high sensitivity with respect to stress reduces, accordingly permitting the reduction of the stress applied to the element region 1a. As a result, it is possible to reduce deviation of an electrical characteristic value obtained from a circuit formed in the element region 1a from an original value. As described above, with the above-mentioned structure, the semiconductor device 21 capable of reducing the stress to be applied to the semiconductor element 1 from the encapsulating resin can be achieved.

Description has been given above of an example of a dual flat non-leaded (DFN) package in which the leads 4 are respectively provided to the two side surfaces of the encapsulating resin 2, but the present technology is also applicable to a quad flat non-leaded (QFN) package in which the leads 4 are respectively provided to four side surfaces of the encapsulating resin 2.

Figure 2A:
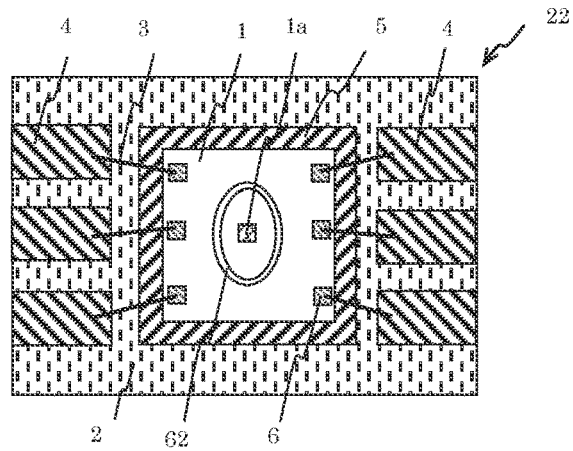
FIG. 2A, FIG. 2B, and FIG. 2C show a semiconductor device according to a second embodiment of the present invention.
Figure 2B:
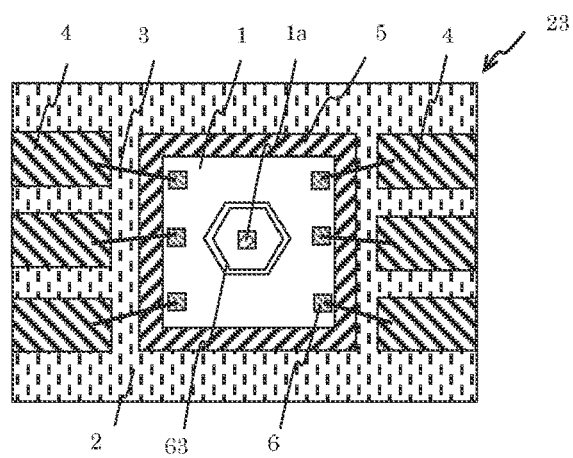
Figure 2C:
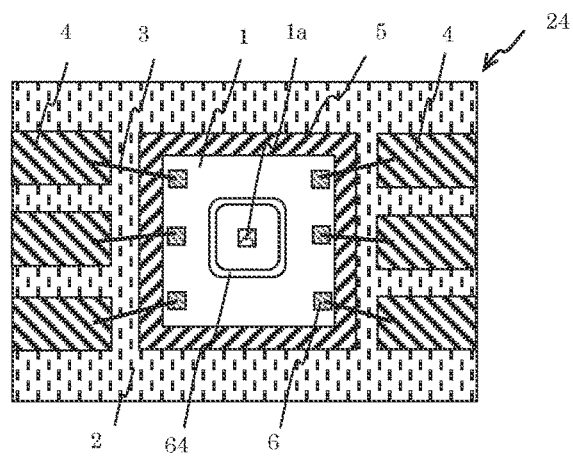

FIG. 2A to FIG. 2C show a semiconductor device according to the second embodiment of the present invention, and are plan views for illustrating various shapes of the recessed portion. A semiconductor device 22 illustrated in FIG. 2A represents an example in which a planar projection region of a recessed portion 62 has an elliptical peripheral portion, and the element region 1a having a high sensitivity with respect to stress is provided in the vicinity of the center of a region surrounded by the ellipse. A semiconductor device 23 illustrated in FIG. 2B represents an example in which a planar projection region of a recessed portion 63 has a polygonal peripheral portion in which all interior angles are obtuse angles. The element region 1a having a high sensitivity with respect to stress is provided in the vicinity of the center of the polygonal peripheral portion. A semiconductor device 24 illustrated in FIG. 2C represents an example in which a planar projection region of a recessed portion 64 has a rectangular peripheral portion with rounded corners. The element region 1a having a high sensitivity with respect to stress is provided in the vicinity of the center of a region surrounded by the rectangle with rounded corners. As described above, in any of the shapes, a part of the peripheral portion of each of the recessed portions 62, 63, and 64 does not have a region with an acute angle. With such shapes, excessive stress is not applied to a part of the peripheral portion, and accordingly excessive stress is prevented from being applied to the element region 1a having a high sensitivity with respect to stress. The cross-sectional shape in the second embodiment is an inverted trapezoid shape similarly to that illustrated in FIG. 1A.

Figure 3:
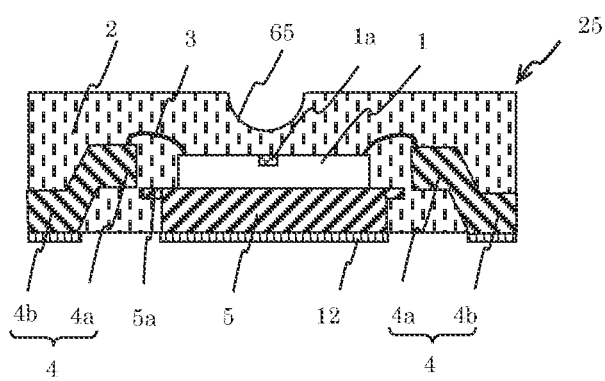
FIG. 3 shows a semiconductor device according to a third embodiment of the present invention.

FIG. 3 is a structure view for illustrating a semiconductor device according to a third embodiment of the present invention. This semiconductor device is different from the semiconductor device 21 according to the first embodiment illustrated in FIG. 1A and FIG. 1B in a cross-sectional shape of a recessed portion 65. Description is given below by means of a semiconductor device of a non-leaded type having the lead structure different from that of the first embodiment.

The semiconductor element 1 is mounted on the die pad 5, and the leads 4 are provided around the die pad 5 so as to be spaced apart from the die pad 5. The electrode pads (not shown) on the semiconductor element 1 are electrically connected to the leads 4 by the wires 3, respectively. Each of the leads 4 includes an inner lead portion 4a and an outer lead portion 4b, and each of the leads 4 is bent so that the inner lead portion 4a becomes higher than the outer lead portion 4b. Further, the semiconductor element 1 on the die pad 5, the wires 3, and the leads 4 are encapsulated by the encapsulating resin 2. The back surface of the die pad 5 on the opposite side of the surface on which the semiconductor element 1 is mounted is exposed from the encapsulating resin 2, and the exposed surface is covered with the plating layer 12 to be excellent in heat radiation performance. The die pad 5 has, at an upper end portion thereof, a thinned portion 5a obtained by reducing the thickness of the die pad 5. The encapsulating resin 2 extends to a back surface of the thinned portion 5a, to thereby achieve the structure in which the die pad 5 is less liable to slip out from the encapsulating resin.

The inner lead portions 4a of the leads 4 are encapsulated by the encapsulating resin 2, but the back surface of the die pad 5 and bottom surfaces of the outer lead portions 4b which are flush with the bottom surface of the encapsulating resin 2 are exposed from the encapsulating resin 2 to be covered with the plating layer 12.

In the first embodiment, the bottom surface of the recessed portion 61 formed in the encapsulating resin 2 is parallel to the upper surface of the semiconductor element 1, but in the third embodiment, the recessed portion 65 formed in the encapsulating resin 2 has a hemispherical inner surface. With such a shape, stress from the encapsulating resin 2 is dispersed in the spherical inner surface, and stress to be applied to the element region 1a having a high sensitivity with respect to stress is reduced. Further, the planar shapes illustrated in FIG. 1B and FIG. 2A to FIG. 2C can be applied to the recessed portion 65. Also in those cases, the planar projection region of the recessed portion 65 is desired to be formed so as not to overlap the regions in which the electrode pads 6 are arranged. In this manner, a semiconductor device 25 having high reliability and being capable of reducing the stress to be applied to the semiconductor element 1 from the encapsulating resin can be achieved. The third embodiment has been described by means of a non-leaded type semiconductor device in which the leads 4 have upset structure, but forming the recessed portion 65 to have a spherical inner surface is also applicable to other non-leaded type semiconductor devices as illustrated in FIG. 1A and FIG. 1B.

FIG. 3 shows an example in which a hemispherical surface is adopted, but the present invention is not limited to this example. Concave curved surfaces having various curvatures are applicable, and a curved surface having a smaller depth than that in the illustrated example may also be applied.

Figure 4A:
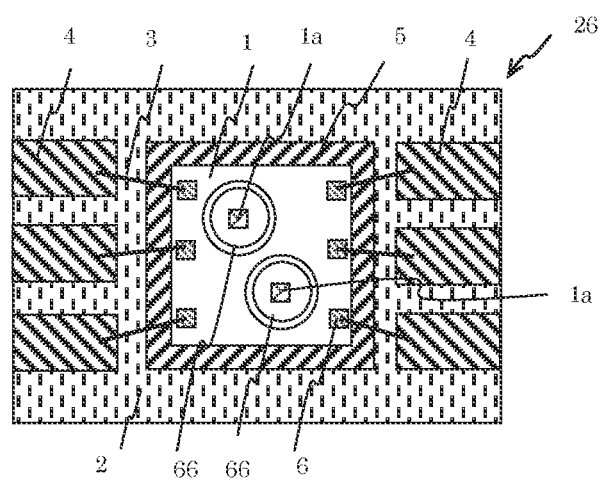
FIG. 4A and FIG. 4B shows a semiconductor device according to a fourth embodiment of the present invention.
Figure 4B:
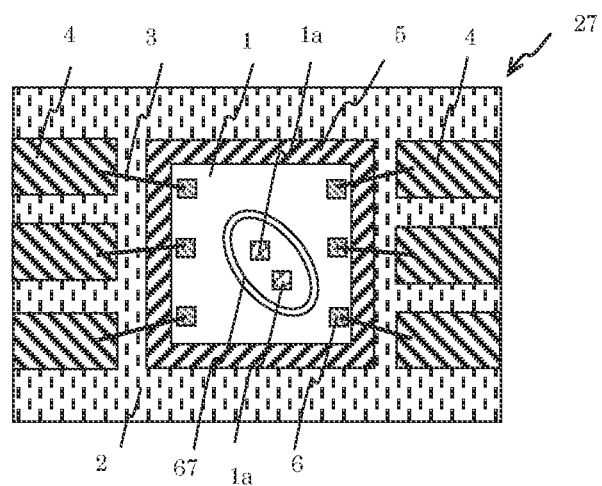

FIG. 4A and FIG. 4B show a semiconductor device according to a fourth embodiment of the present invention. This semiconductor device is different from the semiconductor device 21 illustrated in FIG. 1A and FIG. 1B in that the semiconductor device has a plurality of element regions 1a having a high sensitivity with respect to stress. As illustrated in FIG. 4A, the following semiconductor device 26 is preferred. The semiconductor element 1 has, in parts of the surface thereof, a plurality of element regions 1a having a high sensitivity with respect to stress, and a plurality of recessed portions 66 are formed in the surface of the encapsulating resin 2 at positions above the element regions a. However, as illustrated in FIG. 4B, in a case in which the plurality of element regions 1a having a high sensitivity with respect to stress are provided close to each other, the number of recessed portions 67 may be one. The planar shapes and the cross-sectional shapes illustrated in FIG. 1A and FIG. 1B to FIG. 3 can be applied to the recessed portion 67. Further, also in those cases, the planar projection region of the recessed portion 67 is desired to be formed so as not to overlap the regions in which the electrode pads 6 are arranged. In this manner, a semiconductor device 27 having high reliability and being capable of reducing the stress to be applied to the semiconductor element 1 from the encapsulating resin can be achieved.

Figure 5:
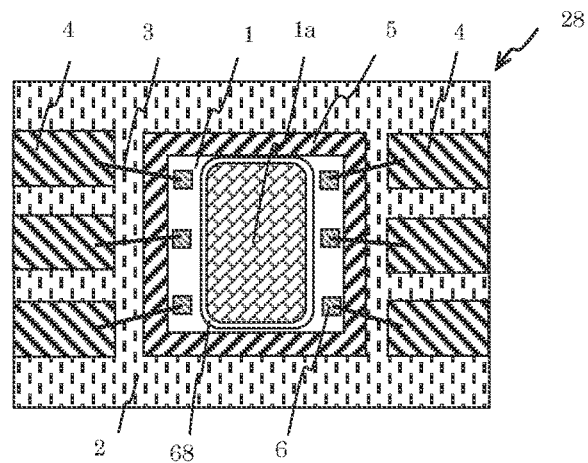
FIG. 5 shows a semiconductor device according to a fifth embodiment of the present invention.

FIG. 5 is a structure view for illustrating a semiconductor device according to a fifth embodiment of the present invention. In a case in which the entire region of the surface of the semiconductor element 1 excluding the regions in which the electrode pads 6 are arranged is the element region 1a having a high sensitivity with respect to stress, as illustrated in FIG. 5, a recessed portion 68 is formed so as to include and surround the periphery of the element region of the semiconductor element 1. The planar projection region of the recessed portion 68 is desired to be formed so as not to overlap the regions in which the electrode pads 6 are arranged. Further, the recessed portion 68 is preferred to be shaped so that a part of the peripheral portion of the recessed portion 68 does not have a region with an acute angle, such as a rectangle with rounded corners. With the above-mentioned structure, a semiconductor device 28 having high reliability and being capable of reducing the stress to be applied to the semiconductor element 1 from the encapsulating resin can be achieved.

Figure 6A:
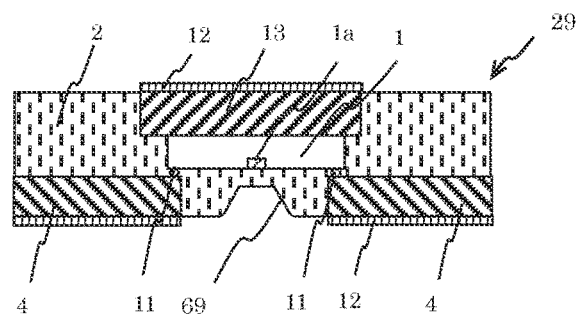
FIG. 6A and FIG. 6B show a semiconductor device according to a sixth embodiment of the present invention.
Figure 6B:
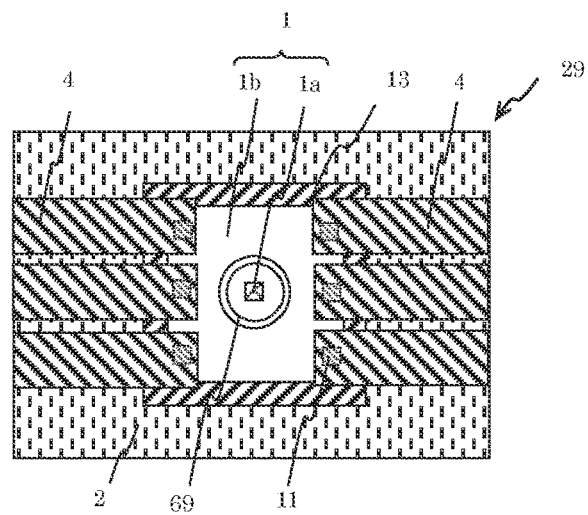

FIG. 6A and FIG. 6B show a semiconductor device according to a sixth embodiment of the present invention. The sixth embodiment is different from the first embodiment in that a flip-chip bonding method is used instead of using the wire bonding method.

In the first embodiment, there is employed the structure in which the element surface of the semiconductor element 1 is directed opposite to the leads 4, but in the sixth embodiment, there is employed the structure in which, as illustrated in a cross-sectional view of FIG. 6A, the element surface of the semiconductor element 1 fixed to a lower surface of a heat radiation plate 13 made of a metal material is directed toward the leads 4. Thus, the heat radiation plate 13 also functions as a die pad. Bump electrodes 11 are provided on the element surface of the semiconductor element 1, and the element surface of the semiconductor element 1 faces and is electrically connected to the leads 4 by the bump electrodes 11. Each of the bump electrodes 11 is made of a metal material such as tin (Sn) or gold (Au).

The heat radiation plate 13 and the leads 4 sandwich the semiconductor element 1 from above and below. In this structure, the semiconductor element 1, the heat radiation plate 13, and the leads 4 are covered with the encapsulating resin 2. However, a back surface of the heat radiation plate 13, that is, a surface corresponding to an upper surface of the heat radiation plate 13 in FIG. 6A is exposed from the encapsulating resin 2 to be covered with the plating layer 12. Further, the bottom surfaces and the outer side surfaces of the leads 4 are also exposed from the encapsulating resin 2, and the exposed surfaces of the bottom surfaces of the leads 4 are also covered with the plating layer 12. Thus, a non-leaded type semiconductor device 29 in which the outer side surfaces of the leads 4 are not protruded from the side surfaces of the encapsulating resin is achieved.

The semiconductor element 1 has, in a part of the surface thereof, the element region 1a having a high sensitivity with respect to stress, and a recessed portion 69 is formed in the surface of the encapsulating resin 2 at a position below the element region 1a. The recessed portion 69 is selectively formed below the element region 1a having a high sensitivity with respect to stress, and is formed not to overlap the entire region of the semiconductor element 1. In this case, the recessed portion 69 has a trapezoid shape in cross section. The upper base of the trapezoid is shorter than the lower base thereof, and leg portions of the trapezoid are tapered to expand toward the lower base. Further, the upper base, the lower base, and the upper surface of the semiconductor element 1 are parallel to one another.

FIG. 6B is a plan view as viewed from the bottom surface side of the semiconductor device 29. The plating layer 12 is not shown. The heat radiation plate 13 made of a copper material is arranged in a center region of the rectangular encapsulating resin 2. A plurality of leads 4 are arranged along one side (side surface) of the encapsulating resin 2, and a plurality of leads 4 are arranged along another side (side surface) opposed to the one side. Further, the leads 4 arranged along the respective sides (side surfaces) face each other with the heat radiation plate 13 serving as the center. The semiconductor element 1 is fixed to the heat radiation plate 13, and the bump electrodes 11 arranged at the outer circumference of the semiconductor element 1 overlap the leads 4 to be electrically connected to the leads 4. The semiconductor element 1 has the element region 1a having a high sensitivity with respect to stress, and the element region 1b having a relatively low sensitivity with respect to stress relatively to the element region 1a. For example, a current mirror circuit is a circuit which uses the fact that the same current flows between P-channel MOS transistors forming a pair, to thereby use the action of currents of two current paths being equal to each other. However, application of stress to this circuit causes deviation of the currents of the two current paths. Such transistors forming a pair are required to have characteristics that are not much different from each other, and are desired to be formed in the above-mentioned element region 1a having a high sensitivity with respect to stress.

A planar projection region obtained by projecting the recessed portion 69 onto the semiconductor element 1 is formed so as to include and surround the periphery of the element region 1a having a high sensitivity with respect to stress, and a peripheral portion of the planar projection region has a circular shape. Further, the element region 1a having a high sensitivity with respect to stress is provided in the vicinity of the center of the region surrounded by this circle. The bump electrodes 11 are arranged in the outer circumference region of the semiconductor element 1, but the planar projection region of the recessed portion 69 does not overlap the regions in which the bump electrodes 11 are arranged because the leads 4 and the bump electrodes 11 overlap each other.

The recessed portion 69 is formed in the surface of the encapsulating resin 2 at a position below the element region 1a having a high sensitivity with respect to stress. In this manner, the thickness of the encapsulating resin 2 above the element region 1a having a high sensitivity with respect to stress can be reduced, and accordingly the stress to be applied to the element region 1a can be reduced. As a result, it is possible to reduce deviation of an electrical characteristic value obtained from a circuit formed in the element region 1a from an original value. As described above, with the above-mentioned structure, the semiconductor device 29 capable of reducing the stress to be applied to the semiconductor element 1 from the encapsulating resin can be achieved.

Description has been given above of an example of a dual flat non-leaded (DFN) package in which the leads 4 are respectively provided to the two side surfaces of the encapsulating resin 2, but the present technology is also applicable to a quad flat non-leaded (QFN) package in which the leads 4 are respectively provided to the four side surfaces of the encapsulating resin 2. Further, the planar shapes and the cross-sectional shapes illustrated in FIG. 1A and FIG. 1B to FIG. 3 can be applied to the recessed portion 69.

Figure 7A:
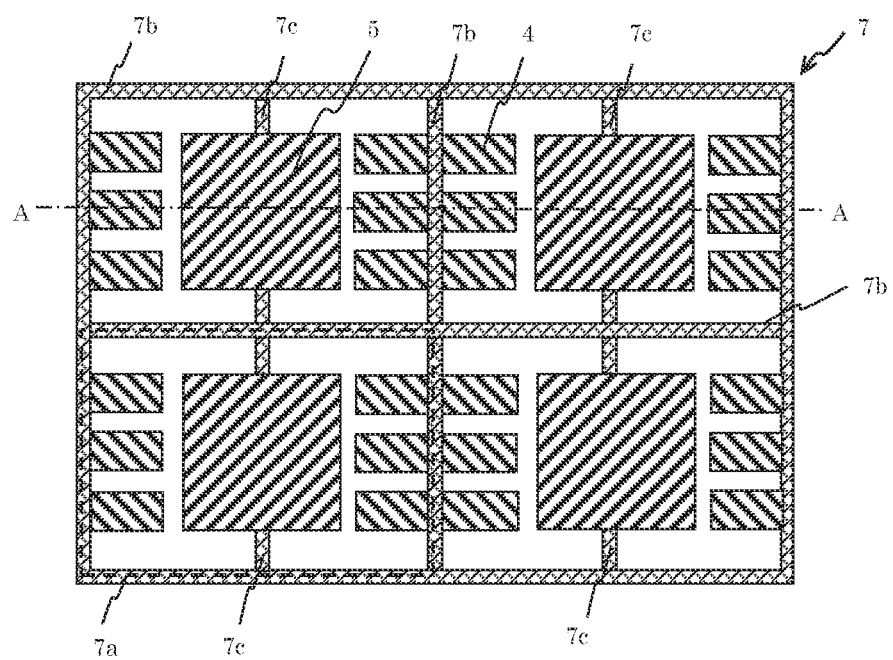
FIG. 7A, FIG. 7B, and FIG. 7C show a method of manufacturing the semiconductor device according to the first embodiment of the present invention.
Figure 7B:
Figure 7C:
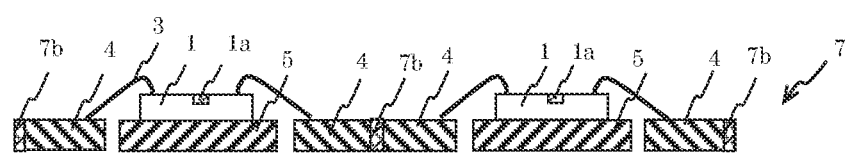

FIG. 7A to FIG. 7C show a method of manufacturing the semiconductor device according to the first embodiment of the present invention. First, as illustrated in FIG. 7A, a lead frame 7 including the die pads 5 and the plurality of leads 4 is prepared. The plurality of leads 4 are arranged around each of the die pads 5 so as to be spaced apart therefrom. The lead frame 7 has a shape including a plurality of units 7a each of which includes the rectangular die pad 5 and the plurality of leads 4 arranged so as to be spaced apart from the die pad 5. As indicated by the broken line, each of the illustrated units 7a is surrounded by frame rims 7b. The leads 4 are connected to the frame rims 7b, and the die pad 5 is connected to the frame rims 7b by suspension leads 7c. The lead frame 7 is mainly made of a copper material. FIG. 7B is a cross-sectional view taken along the line A-A of FIG. 7A. At this stage, the leads 4 of adjacent units 7a are connected to each other by the frame rims 7b.

Next, as illustrated in FIG. 7C, the semiconductor elements 1 are mounted on the die pads 5, and the electrode pads (not shown) provided on each of the semiconductor elements 1 are electrically connected to the leads 4 by the wires 3, respectively.

Figure 8A:
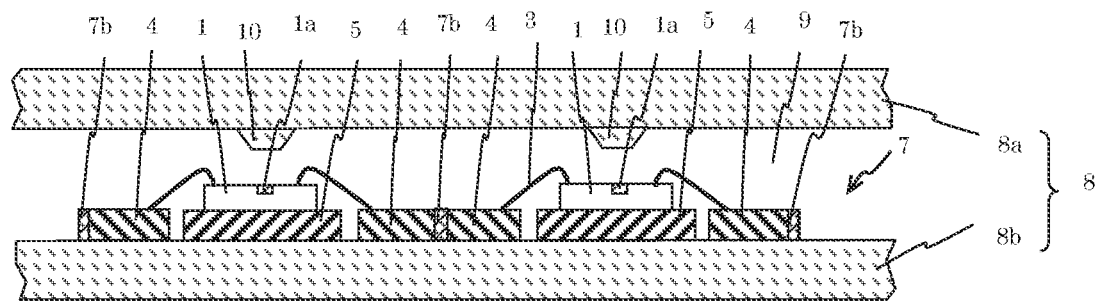
FIG. 8A, FIG. 8B, and FIG. 8C show the method of manufacturing the semiconductor device according to the first embodiment of the present invention.
Figure 8B:
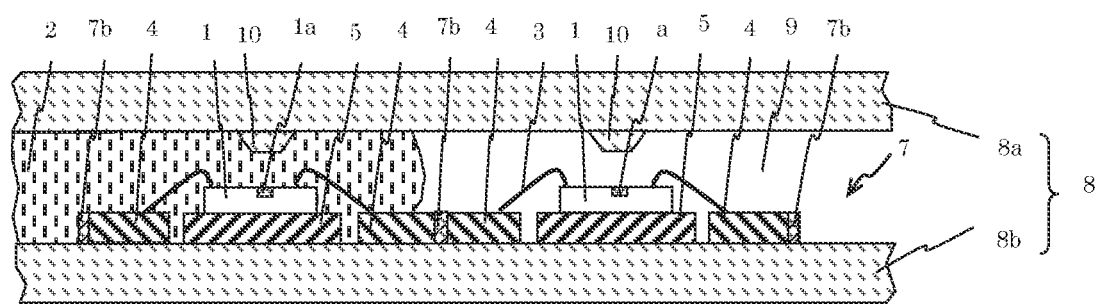
Figure 8C:
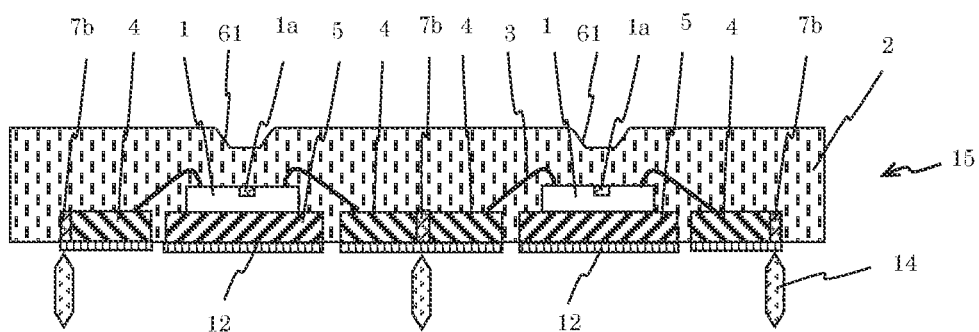

FIG. 8A to FIG. 8C, following FIG. 7A to FIG. 7C, show the method of manufacturing the semiconductor device according to the first embodiment of the present invention. As illustrated in FIG. 8A, a mold 8 for encapsulating the lead frame 7 having the semiconductor elements 1 mounted thereon is prepared. The mold 8 includes an upper mold 8a and a lower mold 8b, and a cavity 9 is formed between the upper mold 8a and the lower mold 8b. Further, protruding portions 10 are provided so as to protrude from the upper mold 8a toward the cavity 9. Each of the protruding portions 10 is positioned above the element region 1a having a high sensitivity with respect to stress in a part of the surface of the semiconductor element 1. The protruding portion 10 illustrated here has a trapezoid cross-sectional shape.

In order to obtain the recessed portion 61 illustrated in FIG. 1A and FIG. 1B, the protruding portion 10 is required to have a truncated conical shape. Further, in order to obtain the recessed portion 62 illustrated in FIG. 2A, an elliptical frustum shaped protruding portion 10 is required, and in order to obtain the recessed portion 63 illustrated in FIG. 2B, a truncated pyramid shaped protruding portion 10 is required.

As illustrated in FIG. 8B, the encapsulating resin 2 is caused to flow into the cavity 9 formed between the upper mold 8a and the lower mold 8b so that the semiconductor elements 1, the die pads 5, the wires 3, and the leads 4 are encapsulated by the encapsulating resin 2. At this time, each of the semiconductor elements 1 has, in a part of the surface thereof, the element region 1a having a high sensitivity with respect to stress, and the recessed portion 61 is formed in the surface of the encapsulating resin 2 at a position above the element region 1a. At the time of encapsulation, the recessed portion 61 is formed so as to face the protruding portion 10 of the upper mold 8a.

As illustrated in FIG. 8C, an encapsulated body 15 is taken out from the mold 8, and the plating layer 12 is formed on the back surfaces of the die pads 5 and the bottom surfaces of the leads 4. After that, a rotating blade 14 is used to cut the encapsulated body 15 along the frame rims 7b. At this time, the width of the rotating blade 14 is set to be larger than the width of the frame rim 7b so that the frame rims 7b can be completely removed. The cutting direction by the rotating blade 14 may be any of an upward direction from the bottom surface of the encapsulated body 15 and a downward direction from the upper surface thereof.

Figure 9A:
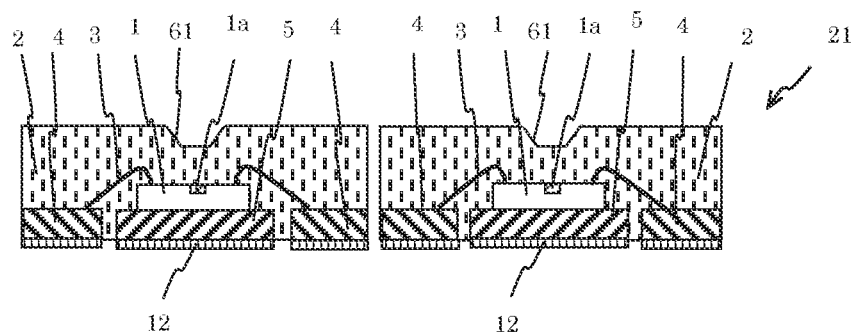
FIG. 9A and FIG. 9B show the method of manufacturing the semiconductor device according to the first embodiment of the present invention.
Figure 9B:
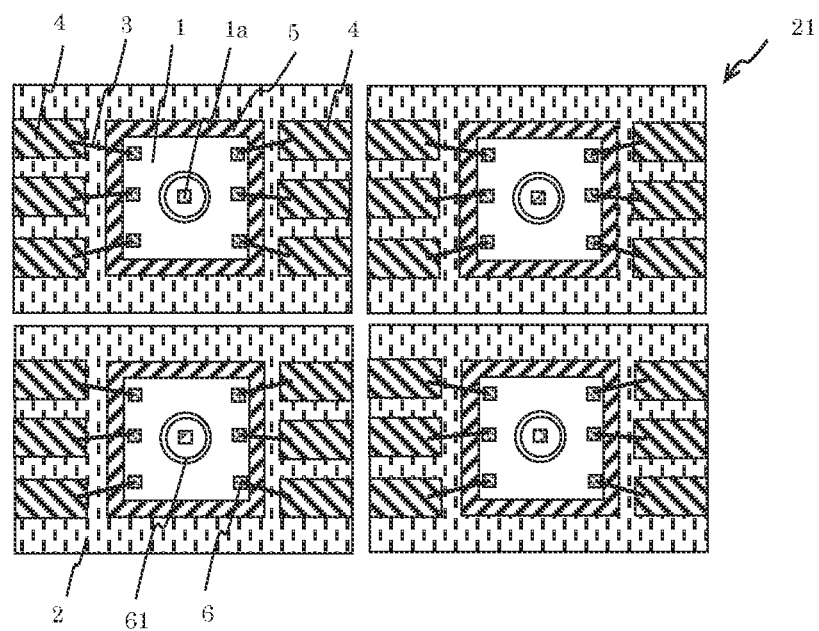

After the cutting, the individually separated semiconductor devices 21 are obtained as illustrated in FIG. 9A and FIG. 9B. FIG. 9A and FIG. 9B are a cross-sectional view and a plan view, respectively, in which a plurality of semiconductor devices 21 are illustrated as an aggregate. Description has been given above of a method of obtaining a plurality of semiconductor devices from one cavity of the mold, but an encapsulating method of obtaining one semiconductor device from one cavity can also be adopted.

Next, the electrical characteristics of the obtained semiconductor device 21 are tested. Thus, the electrical characteristics are compared with electrical characteristics obtained by a probing test performed before the assembly of the semiconductor element 1 incorporated in the semiconductor device 21 to check a characteristic variation amount. Subsequent steps are not required to be performed in a case in which this characteristic variation amount is within a test reference. In a case in which the characteristic variation amount exceeds the test reference, the subsequent steps are added to correct the electrical characteristics.

Figure 10:
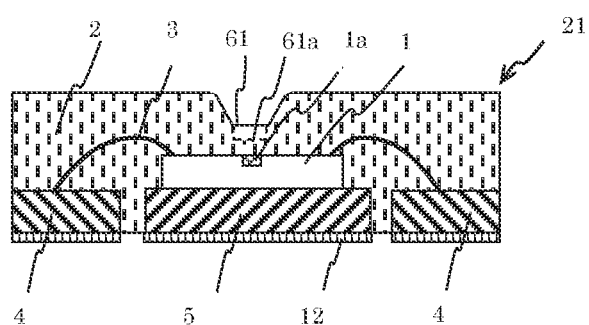
FIG. 10 shows the method of manufacturing the semiconductor device according to the first embodiment of the present invention.

As illustrated in FIG. 10, the electrical characteristics are corrected by removing a part of the encapsulating resin 2 at the bottom surface of the recessed portion 61 by a predetermined amount to further increase the depth of the recessed portion 61. The predetermined amount to be removed of the bottom surface of the recessed portion 61 can be obtained from a relationship expression between a correction amount of the electrical characteristics and a removal amount which has been determined in advance by pre-evaluation performed in advance with samples. The encapsulating resin 2 at the bottom surface of the recessed portion 61 is removed by laser processing or mechanical router processing, and the bottom surface indicated by the solid line of the recessed portion 61 before the processing becomes deeper as a bottom surface indicated by the broken line of a recessed portion 61a after the processing. At this time, the removal amount of the encapsulating resin 2 is desired to be uniform throughout the entire bottom surface of the recessed portion 61.

After a part of the encapsulating resin 2 is removed, the electrical characteristics are tested again, and the electrical characteristics are compared with the electrical characteristics obtained by the probing test to check the characteristic variation amount. Subsequent steps are not required to be performed in a case in which this characteristic variation amount is within the test reference. In a case in which the characteristic variation amount exceeds the test reference, the above-mentioned step of correcting the electrical characteristics is additionally performed until the characteristic variation amount falls within the test reference. In a case in which it is determined that the characteristic variation amount cannot be corrected, the semiconductor device 21 is handled properly as a defective product. The semiconductor device 21 obtained through the above-mentioned additional step has extremely small deviation from the electrical characteristics of the semiconductor element 1 alone, and is the semiconductor device 21 satisfying required performance enough.

What is claimed is:

1. A semiconductor device, comprising:
    a die pad;
    a semiconductor element mounted on the die pad, and having an element region having a high sensitivity with respect to stress;
    a lead arranged to be spaced apart from the die pad, and electrically connected to the semiconductor element;
    an encapsulating resin encapsulating the die pad, the semiconductor element, and the lead; and
    a recessed portion formed on a surface of the encapsulating resin at a position above the element region,
    wherein a planar projection region defined as a planar projection of the recessed portion onto the semiconductor element is provided to surround the element region that is a part of the semiconductor element.

2. The semiconductor device according to claim 1, wherein the planar projection region has a polygonal peripheral portion in which all interior angles are obtuse angles.

3. The semiconductor device according to claim 1, wherein the planar projection region has one of a circular peripheral portion and an elliptical peripheral portion.

4. The semiconductor device according to claim 1, wherein the planar projection region is provided in an inner region of the semiconductor element excluding a region of the semiconductor element in which an electrode pad is formed.

5. The semiconductor device according to claim 2, wherein the planar projection region is provided in an inner region of the semiconductor element excluding a region of the semiconductor element in which an electrode pad is formed.

6. The semiconductor device according to claim 3, wherein the planar projection region is provided in an inner region of the semiconductor element excluding a region of the semiconductor element in which an electrode pad is formed.

7. The semiconductor device according to claim 1, wherein the recessed portion has an inverted trapezoid shape in a cross-sectional view.

8. The semiconductor device according to claim 2, wherein the recessed portion has an inverted trapezoid shape in a cross-sectional view.

9. The semiconductor device according to claim 3, wherein the recessed portion has an inverted trapezoid shape in a cross-sectional view.

10. The semiconductor device according to claim 4, wherein the recessed portion has an inverted trapezoid shape in a cross-sectional view.

11. The semiconductor device according to claim 3, wherein the recessed portion is a part of a curved surface.

12. The semiconductor device according to claim 4, wherein the recessed portion is a part of a curved surface.

13. The semiconductor device according to claim 5, wherein the recessed portion is a part of a curved surface.

14. The semiconductor device according to claim 6, wherein the recessed portion is a part of a curved surface.

15. A method of manufacturing a semiconductor device including:
a die pad;
a semiconductor element mounted on the die pad, the semiconductor element comprising and having an element region having a high sensitivity with respect to stress;
a lead arranged to be spaced apart from the die pad, and electrically connected to the semiconductor element; and
an encapsulating resin encapsulating the die pad, the semiconductor element, and the lead,
the method comprising:
preparing the die pad and the lead arranged to be spaced apart from the die pad, and mounting the semiconductor element on the die pad;
preparing a mold which is used to encapsulate the lead and the die pad on which the semiconductor element is mounted, and has a protruding portion to form a recessed portion; and
encapsulating the die pad having the semiconductor element and forming the recessed portion facing the protruding portion in a surface of the encapsulating resin at a position above the element region having a high sensitivity with respect to stress of the semiconductor element in order that a planar projection region defined as a planar projection of the recessed portion onto the semiconductor element is provided to surround the element region that is a part of the semiconductor element.

16. The method of manufacturing a semiconductor device according to claim 15, further comprising:
testing electrical characteristics of the semiconductor device; and
correcting the electrical characteristics obtained by the testing,
wherein the correcting includes removing a bottom surface of the recessed portion.

17. The method of manufacturing a semiconductor device according to claim 16, wherein the removing a bottom surface of the recessed portion includes removing a part of the encapsulating resin by laser processing.

18. The method of manufacturing a semiconductor device according to claim 16, wherein the removing a bottom surface of the recessed portion includes removing a part of the encapsulating resin by router processing.

* * * * *